United States Patent [19]
Kim et al.

[11] Patent Number: 5,404,138
[45] Date of Patent: Apr. 4, 1995

[54] APPARATUS FOR DECODING VARIABLE LENGTH CODES

[75] Inventors: Seong Dae Kim; Yi Han Kim; Sang Zee Lee, all of Daejon, Rep. of Korea

[73] Assignee: Agency for Defense Development, Daejon, Rep. of Korea

[21] Appl. No.: 143,476

[22] Filed: Oct. 26, 1993

[30] Foreign Application Priority Data

Sep. 11, 1993 [KR] Rep. of Korea ............... 18315/1993

[51] Int. Cl.⁶ .............................................. H03M 7/40
[52] U.S. Cl. ...................................................... 341/67
[58] Field of Search ...................... 341/67, 55, 63, 65, 341/106

[56] References Cited

U.S. PATENT DOCUMENTS 5,173,695 12/1992 Sun et al. .............................. 341/67
5,233,348 8/1993 Pollman et al. ...................... 341/67

OTHER PUBLICATIONS

A. Mukherjee et al., "Efficient VLSI Designs for Data Transformation of Tree-Based Codes," *IEEE Transaction on circuit and Systems,* pp. 306–314, vol. 38, No. 3, Mar. 1991.

R. Hunter et al., "International Digital Facsmile Coding Standards," *Proceedings of IEEE,* pp. 854–867, vol. 68, No. 7, Jul. 1980.

U. Hofker et al., "VLC Encoder/Decoder Chip for Digital HDTV Recording," *Heinrich–Hertz–Institut fur Nachrichtenchnik Berlin GmbH,* Proceedings of International Workshop on HDTV, pp. 45.1–45.4, Nov.18–20, 1992 Kawasaki, Japan.

Y. Yan, "A High Speed Variable Length Decoder for Digital HDTV System," *Industrial Technology Research Institute Computer & Communication Research Lab,* Proceedings of International Workshop on HDTV, pp. 45.1–45.4, Nov. 18–20, 1992, Kawasaki, Japan.

*Primary Examiner*—Brian K. Young
*Attorney, Agent, or Firm*—Darby & Darby

[57] ABSTRACT

An apparatus for decoding variable length codes utilizing a parallel processing based on a code classification wherein an address determining logic receives output data from a barrel shifter, determines addresses by groups according to the received data, classifies and designates addresses of a decoder look-up table by groups according to the addresses determined by groups. As a result, a high processing speed can be obtained, over the conventional serial processing system. Moreover, no code deformation is required as in Lukacs system. The memory capacity of the decoder look-up table can be reduced, as compared with the conventional parallel processing method. In addition, the present invention can be applied to decoding of all variable length codes having a prefix structure.

4 Claims, 4 Drawing Sheets

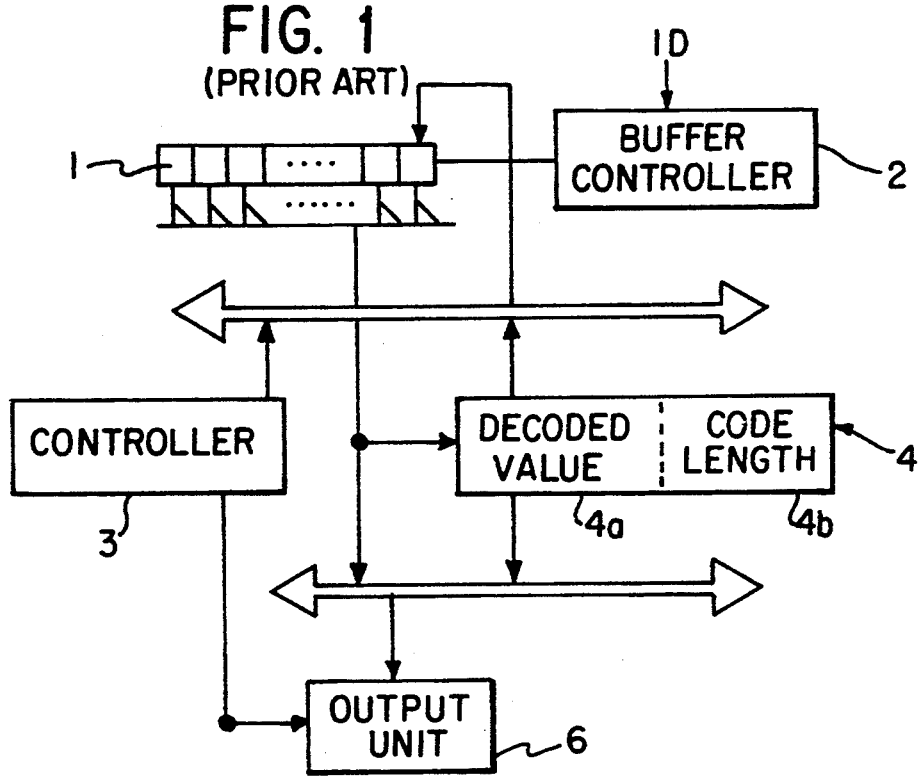

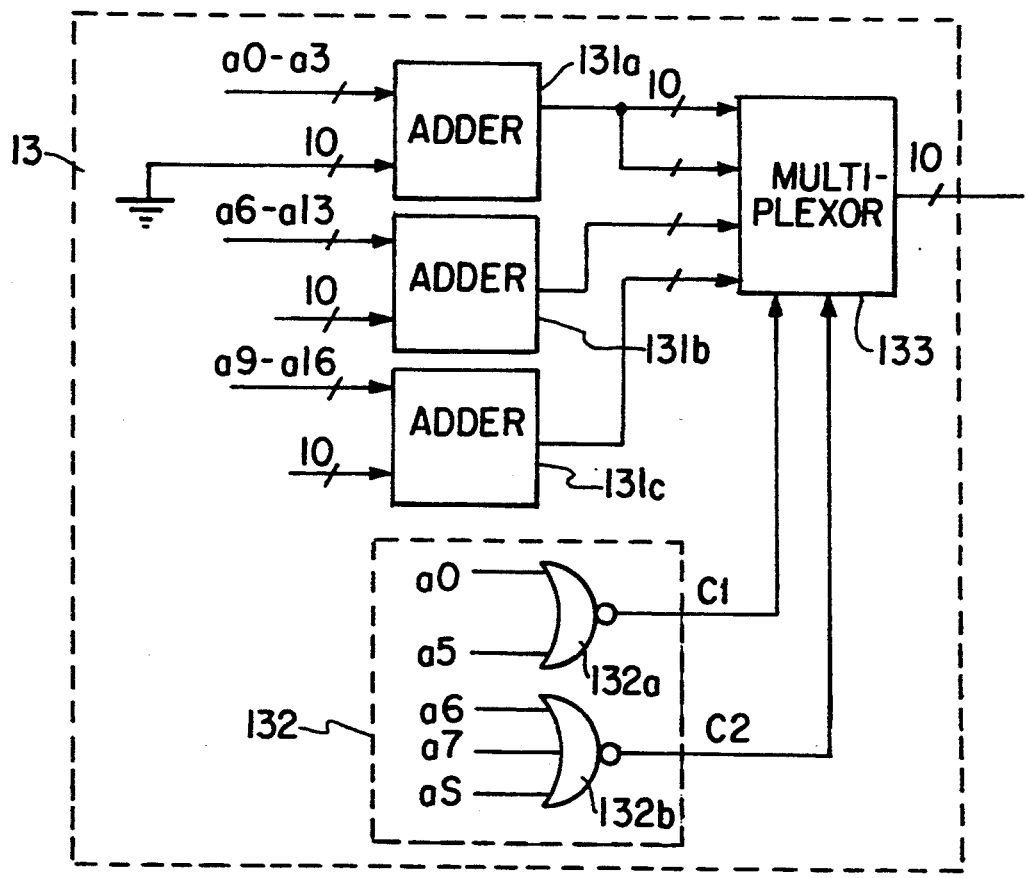

FIG. 6A
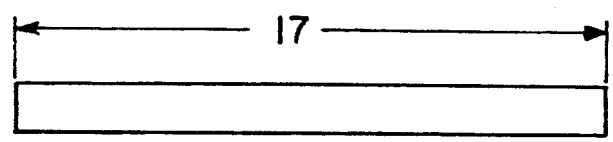
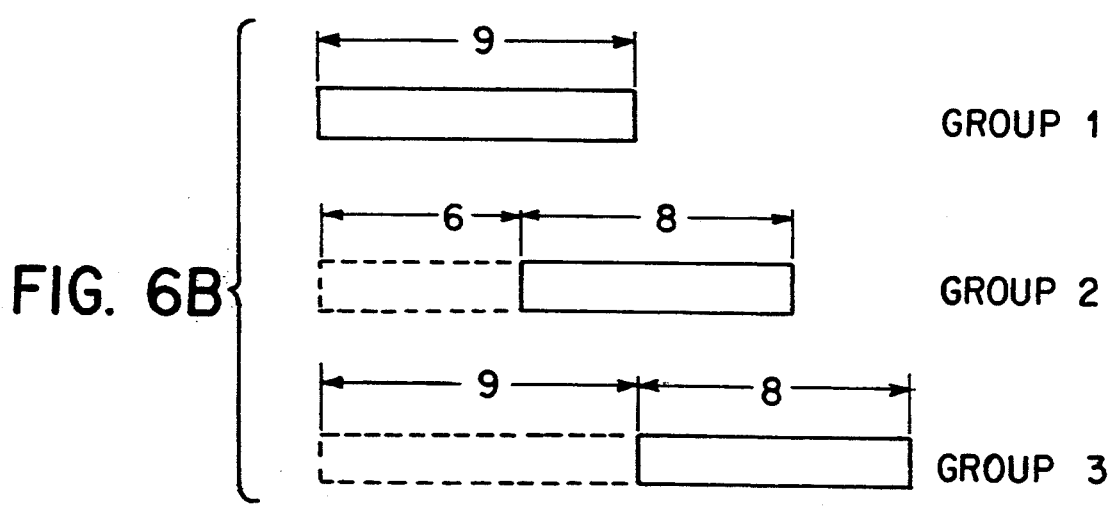
FIG. 6B

APPARATUS FOR DECODING VARIABLE LENGTH CODES

BACKGROUND OF THE INVENTION

1. Field of the Invention

The present invention relates to an apparatus for decoding variable length codes, and more particularly to a variable length decoder utilizing a parallel processing based on a code classification.

2. Description of the Prior Art

Decoding of variable length codes is relatively complex over variable length coding because adjacent codes on an encoded bit stream have no definite boundary therebetween.

Various methods for solving such a complexity have been proposed. The simplest system is the serial processing system utilizing a tree structure search method. In this system, however, it is difficult to realize a high speed hardware by using the current CMOS technique because processing of data is carried out by the unit of bits. As a result, this system has been hardly utilized lately.

A parallel processing system in which processing of data is carried out by the unit of words has been also proposed.

Such a parallel processing system mainly includes a method utilizing a program logic array and a method using a look-up table.

The method utilizing the program logic array has an advantage in that it uses no memory. However, this method becomes difficult to be realized where either of the code length or the number of codes is increased. Furthermore, when codes are deformed, a-hardware should be re-designed. On the other hand, the method using the look-up table has no burden in terms of hardware design because it uses only ROMs or RAMs. In this method, however, a larger memory capacity is necessary when the code length is increased. For instance, if the maximum code length is m, a memory having a capacity of $2^m$ should be used. In this regard, the most important factor in the method using the look-up table is the memory capacity.

For solving such problems, a code deformation has been proposed by Lukacs.

FIG. 1 is a block diagram of a conventional variable length coding decoder proposed by Lukacs. As shown in FIG. 1, the decoder comprises a buffer controller 2 for receiving input data ID and a shift register 1 for receiving output data from the buffer controller 2 and shift-processing the received data. A decoder look-up table 4 is also provided which stored with decoding values 4a and code lengths 4b and adapted to receive output data from the shift register 1 as an address signal. The decoder further comprises an output unit 5 for sending output data read out of the look-up table 4 to external and a control unit 3 for controlling the units of the decoder. Now, operation of the conventional variable length coding decoder with the above-mentioned arrangement will be described.

When the buffer controller 2 receives input data ID, it sends the received input data ID to the shift register 1 so that data is shifted by desired bits. Output data from the shift register 1 is applied as an address signal to the decoder look-up table 4. Accordingly, a decoding value 4a and a code length 4b stored in the address applied to the decoder look-up table 4 are read and then sent to the output unit 5. During the operations, the control unit 3 controls the shift register 1, the decoder look-up table 4 and the output unit 5.

In accordance with Lukacs algorithm, an increase in code length is not made for symbols exhibiting a low probability, under an assumption that when a differential pulse code modulation coding has been achieved with an accurate prediction, most of symbols have similar probability distributions. Symbols are classified into groups each including symbols having similar probabilities, in accordance with Lukacs algorithm. for such symbols, an increase in code length is made only when a coded value reaches a predetermined threshold value. At this time, the length-increased code is made by counting the number of continuous 1s in Huffman code and connecting the counted value in the form of a binary value.

FIG. 2 illustrates a Lukacs code table. As shown in FIG. 2, Lukacs code is made by counting the number of continuous 1s in Huffman code and connecting the counted value in the form of a binary value.

Referring to FIG. 2, it can be understood that the memory capacity is greatly reduced by reducing the code length. However, a degradation in picture quality may occur in a system having a fixed bit rate because the Lukacs codes exhibit a low compression rate over the Huffman codes. Furthermore, this method has a problem that it can be applied only to such a case that the DPCM coding has been carried out.

SUMMARY OF THE INVENTION

Therefore the present invention has been made in view of the above-mentioned problems encountered in the prior arts and an object of the invention is to provide an apparatus for decoding variable length codes utilizing a parallel processing based on a code classification, capable of obtaining a high processing speed over the conventional serial processing system, and greatly reducing the memory capacity with a simple construction involving only an addition of simple logic circuits and without any code deformation as in Lukacs system.

Another object of the invention is to provide an apparatus for decoding variable length codes utilizing a parallel processing based on a code classification, capable of being applied to all variable length codes having a prefix structure.

In accordance with the present invention, these objects can be accomplished by providing an apparatus for decoding variable length codes comprising: an input buffer for receiving input data and temporarily storing it; a barrel shifter for receiving output data from said input buffer and shifting it; an address determining logic for receiving output data from said barrel shifter and determining addresses by groups according to said received data; a decoder look-up table having addresses classified into a plurality of groups, one of which is designated by an address signal from said address determining logic indicative of said determined addresses by groups, and outputting code lengths and decoding values corresponding to respective addresses designated; and a control unit for controlling the input buffer and the barrel shifter, and sending respective decoding values from the decoder look-up table to buses.

BRIEF DESCRIPTION OF THE DRAWINGS

Other objects and aspects of the invention will become apparent from the following description of embodiments with reference to the accompanying drawings in which:

FIG. 1 is a block diagram of a conventional variable length coding decoder proposed by Lukacs;

FIG. 2 is a table illustrating Lukacs codes;

FIG. 4 is a circuit diagram of an address determining logic equipped in the apparatus of FIG. 3;

FIG. 5 is an AC coefficient table of MPEG1 utilized in the present invention; and FIGS. 6A and 6B are schematic views illustrating a code classification method in accordance with the present invention.

DETAILED DESCRIPTION OF THE PREFERRED EMBODIMENTS

Figure 3:
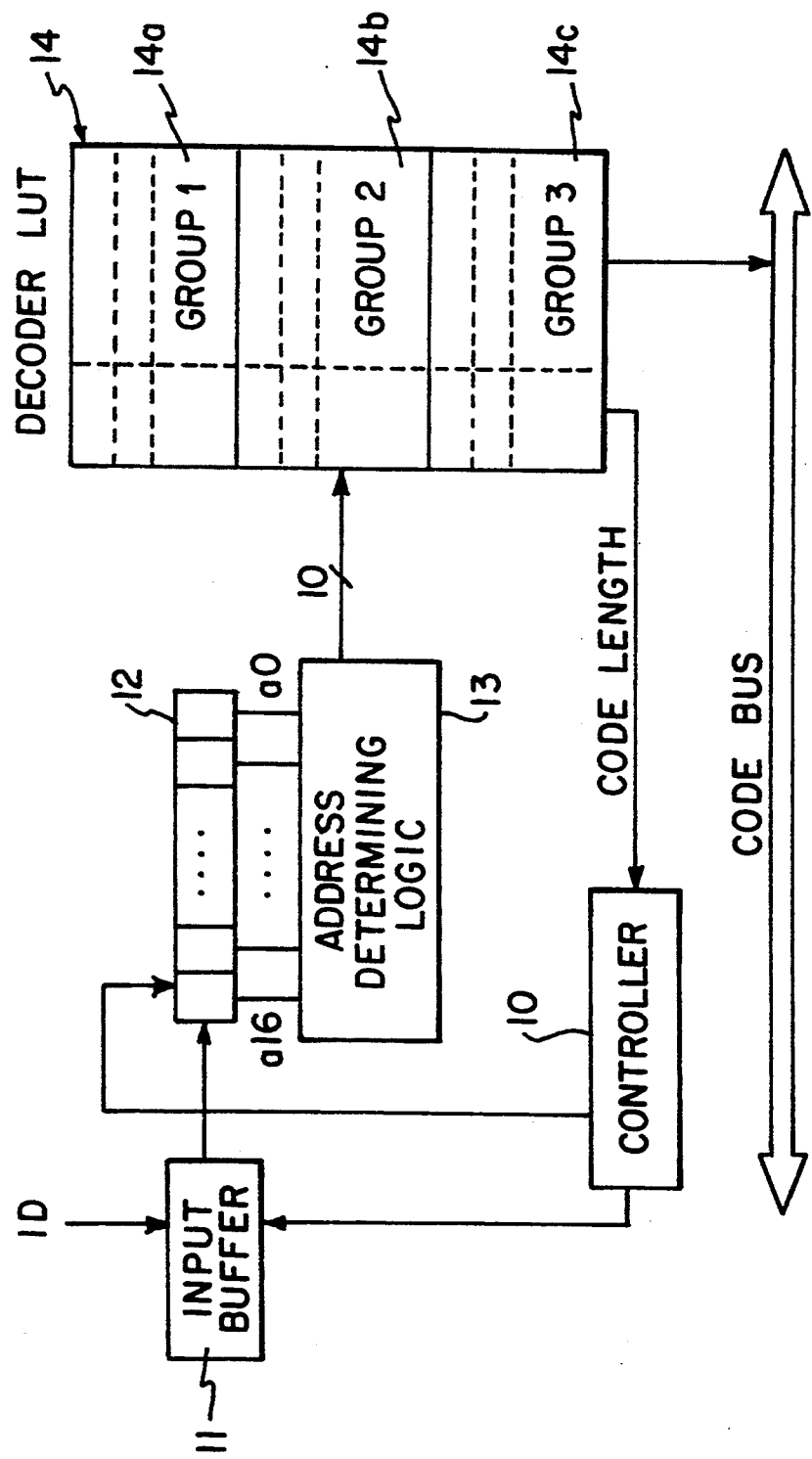
FIG. 3 is a block diagram of an apparatus for decoding variable length codes utilizing a parallel processing based on a code classification in accordance with the present invention.

FIG. 3 is a block diagram of an apparatus for decoding variable length codes utilizing a parallel processing based on a code classification in accordance with the present invention. As shown in FIG. 3, the apparatus comprises an input buffer 11 for receiving input data ID and temporarily storing it, a barrel shifter 12 for receiving output data from the input buffer 11 and shifting it, and an address determining logic 13 for receiving output data $a_0$ to $a_{16}$ from the barrel shifter 12 and determining addresses by groups according to the received data. A decoder look-up table 14 is further provided which is classified into first to third groups 14a, 14b and 14c. The decoder look-up table 14 receives an output signal from the address determining logic 13 and outputs code lengths and decoding values corresponding to respective addresses designated by groups according to the received signal. The apparatus further comprises a control unit 10 for controlling the input buffer 11 and the barrel shifter 12 and sending respective decoding values from the decoder look-up table 14 to buses.

FIG. 4 is a diagram illustrating the address determining logic 13 of FIG. 3. As shown in FIG. 4, the address determining logic 13 comprises adders 131a, 131b and 131c for adding three groups of output data ($a_0$ to $a_8$), ($a_6$ to $a_{13}$) and ($a_9$ to $a_{16}$) of the barrel shifter 12 respectively to ground level of 10 bits, a first address of 10 bits and a second address of 10 bits and outputting the resultant values respectively as addresses of first to third groups, an address mapping logic 132 for NORing output data ($a_0$ to $a_5$) and ($a_6$ to $a_8$) of the barrel shifter 12 through NOR gates 132a and 132b and thereby outputting control signals $C_1$ and $C_2$ and a multiplexor 133 for selecting and outputting one of the address signals of the first to third groups respectively outputted from the adders 131a, 131b and 131c according to the control signals $C_1$ and $C_2$ of the address mapping logic 132.

Operation of the apparatus having the above-mentioned arrangement will now be described.

In accordance with the present invention, a basic property of variable length codes is utilized. Variable length codes have a prefix structure capable of preventing an error from occurring upon finding a codeword having a long length due to a codeword having a shorter length. This makes it possible to classify codes into several groups according to prefix structures.

FIG. 5 is an AC coefficient table of MPEG1 utilized in the present invention. Codes can be classified by using the AC coefficients. FIGS. 6A and 6B illustrate a code classification method in accordance with the present invention. The longest code length of the AC coefficients is 17 bits, as shown in FIG. 8A. As shown in FIG. 6B, AC coefficients are classified into a first group having a code length of no more than 9 bits, a second group having a code length of no more than 14 bits and a prefix code of 6 bits, and a third group having a code length of no more than 17 bits and a prefix code of 9 bits.

As codes are classified as shown in FIG. 6B, the memory capacity is reduced at a rate of 128:1 ($=2^{17}:2^9+2^8+2^8$). Operation of the apparatus utilizing such a principle will now be described, in conjunction with FIGS. 3 and 4.

Input data ID is received in the input buffer 11 to be temporarily stored, and then sent to the barrel shifter 12. At this time, the barrel shifter 12 shifts the input data ID by desired bits under a control of the control unit 10 and thereby applies output data of bit array $a_0$ to $a_{16}$ to the address determining logic 13.

The address determining logic 13 determines addresses by groups according to the received data $a_0$ to $a_{16}$ and designates addresses of the first to third groups 14a, 14b and 14c of the decoder look-up table 14.

In other words, a group including the output data $a_0$ to $a_8$ from the barrel shifter 12 added to ground level of 10 bits in the adder 131a which, in turn, outputs the resultant value as a first group address signal. On the other hand, respective groups including the output data $a_6$ to $a_{13}$ and the output data $a_9$ to $a_{16}$ are added to the first address and the second address in the adders 131b and 131c which, in turn, output the resultant values as second and third group address signals, respectively. The first to third group address signals from the adders 131a, 131b and 131c are applied to the multiplexor 133. At this time, the output data $a_0$ to $a_5$ and the output data $a_6$ to $a_8$ from the barrel shifter 12 are NORed in NOR gates 132a and 132b of the address mapping logic 132, respectively. The NOR gates 132a and 132b apply control signals $C_1$ and $C_2$ resulted from their NORing operations to the multiplexor 133. The multiplexor 133 selects one of the address signals of the first to third groups respectively outputted from the adders 131a, 131b and 131c according to the control signals $C_1$ and $C_2$ of the address mapping logic 132. Where all the output data $a_0$ to $a_8$ have a low, level, both the control signals $C_1$ and $C_2$, the output signals from the NOR gates 132a and 132b of the address mapping logic 132 have a high level. When all the output data $a_0$ to $a_5$ have a low level and at least one of the output data $a_6$ to $a_8$ has a high level, the control signal $C_1$ which is the output signal from the NOR gate 132a has a high level and the control signal $C_2$ which is the output signal from the NOR gate 132b has a low level. On the other hand, when at least one of the output data $a_0$ to $a_5$ has a high level, the control signal $C_1$ has a low level.

When the control signal $C_1$ has a low level, the multiplexor 133 selects and outputs the first group address signal which is the output signal from the adder 131a, irrespective of the level of the control signal $C_2$. This first group address signal designates addresses of the first group 14a of the decoder look-up table 14. When the control signal $C_1$ has a high level and the control signal $C_2$ has a low level, the multiplexor 133 selects and outputs the second group address signal which is the output signal from the adder 131b. This second group address signal designates addresses of the second group 14b of the decoder look-up table 14. On the other hand, when both the control signals $C_1$ and $C_2$ have a high level, the multiplexor 133 selects and outputs the third group address signal which is the output signal from the adder 131c. This third group address signal designates addresses of the third group 14c of the decoder look-up table 14.

As one of the first to third groups of the decoder look-up table 14 are selected and its addresses are designated, coding values and code lengths respectively corresponding to the designated addresses are outputted. In accordance with a preferred embodiment of the present invention, the maximum code length is 9 bits in the first group 14a, 14 in the second group 14b and 17 in the third group 14c. The decoding values respectively outputted from the first to third groups 14a, 14b and 14c of the decoder look-up table 14 are sent to the code buses. On the other hand, the code length information is sent to the control unit 10 so as to be used as information for shifting next input data.

As apparent from the above description, the present invert:ion provides an apparatus for decoding variable length codes utilizing a parallel processing based on a code classification wherein an address determining logic receives output data from a barrel shifter, determines addresses by groups according to the received data, classifies and designates addresses of a decoder look-up table by groups according to the addresses determined by groups. As a result, a high processing speed can be obtained, over the conventional serial processing system. Moreover, no code deformation is required as in Lukacs system. The memory capacity of the decoder look-up table can be reduced, as compared with the conventional parallel processing method. In addition, the present invention can be applied to decoding of all variable length codes having a prefix structure.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for decoding variable length codes comprising:
    an input buffer for receiving input data and temporarily storing it; a barrel shifter for receiving output data from said input buffer and shifting it; an address determing logic comprising plural adders for receiving said output data of barrel shifter and outputting address signals of classified groups; an address mapping logic for logic-combining said output data of the barrel shifter and outputting the resultant values as control signals; and a multiplexor for selecting and outputtting one of said address signals respectively outputted from said adders according to said control signals of the address mapping logic;
    a decoder look-up table having addresses classified into a plurality of groups, one of which is designated by an address signal from said address determining logic indicative of said determined addresses by groups, and outputting code lengths and decoding values corresponding to respective addresses designated; and
    a control unit for controlling the input buffer and the barrel shifter.

2. An apparatus in accordance with claim 1, wherein said adders are adapted to add said output data of said barrel shifter respectively to ground level, a first address and a second address and outputting the resultant values respectively as address signals of plural groups.

3. An apparatus in accordance with claim 1, wherein said address mapping logic comprises NOR gates for NORing the output data of the barrel shifter and outputting the resultant values as control signals.

4. An apparatus in accordance with claim 1 wherein said decoder look-up table has three address groups.

* * * * *